United States Patent [19]

Matanabe et al.

[11] Patent Number: 5,705,230
[45] Date of Patent: Jan. 6, 1998

[54] METHOD FOR FILLING SMALL HOLES OR COVERING SMALL RECESSES IN THE SURFACE OF SUBSTRATES

[75] Inventors: Toru Matanabe, Hopewell Junction, N.Y.; Hirokazu Ezawa, Tokyo, Japan; Masahiro Miyata, Chiba-ken, Japan; Yukio Ikeda, Tokyo, Japan; Manabu Tsujimura, Kanagawa-ken, Japan; Hiroaki Inoue, Kanagawa-ken, Japan; Takeyuki Odaira, Kanagawa-ken, Japan; Naoaki Ogure, Tokyo, Japan

[73] Assignee: Ebara Corporation, Tokyo, Japan

[21] Appl. No.: 324,460

[22] Filed: Oct. 17, 1994

Related U.S. Application Data

[63] Continuation of Ser. No. 32,657, Mar. 17, 1993, abandoned.

[30] Foreign Application Priority Data

Mar. 17, 1992 [JP] Japan ................................. 4-091778

[51] Int. Cl.$^6$ ...................................................... B05D 1/18
[52] U.S. Cl. ........................ 427/438; 205/91; 205/104; 205/191
[58] Field of Search .................... 205/91, 118, 161, 205/191; 427/437, 438, 443.1, 595

[56] References Cited

U.S. PATENT DOCUMENTS

| | | | |
|---|---|---|---|
| 3,194,681 | 7/1965 | Nicholson | 427/601 |
| 4,002,778 | 1/1977 | Bellis et al. | 427/98 |
| 4,024,631 | 5/1977 | Castillero | 205/126 |
| 4,217,183 | 8/1980 | Melcher | 205/92 |
| 4,239,789 | 12/1980 | Blum | 427/555 |
| 4,251,327 | 2/1981 | Grenon | 205/86 |
| 4,349,583 | 9/1982 | Kulynych | 427/581 |
| 4,425,196 | 1/1984 | Bessette et al. | 205/263 |
| 4,496,436 | 1/1985 | Inoue | 205/83 |
| 4,624,749 | 11/1986 | Black et al. | 205/50 |
| 5,151,168 | 9/1992 | Gilton et al. | 205/123 |
| 5,169,680 | 12/1992 | Ting et al. | 427/96 |

OTHER PUBLICATIONS

A.A. Wragg, et al. "Ionic Mass Transfer by Free Convection with Simultaneous Heat Transfer," Electrochimica Acta V.18 p.619 (Mar., 1973).

"Electrodeposition of Metals in Ultrasonic Fields", Sergei Mikhailovich Kochergin, Galina Yakovlevna Vyaelevca, Consultants Bureau, New York (1966) pp. 41 and 44 month unavail.

Selective Electroless Plated Ni Contacts to CMOS Junctions with CoSi$_2$, G. E. Georgiou, et al. *J. Electrochem. Soc.*, V.138 No. 12, Dec., 1991.

Anodic Oxidation of Reductants in Electroless Plating, Izumi Ohno, et al., *J. Electrochem. Soc.*, vol. 132, No. 10, Oct., 1985.

*Primary Examiner*—John Niebling
*Assistant Examiner*—Brendan Mee
*Attorney, Agent, or Firm*—Oblon, Spivak, McClelland, Maier & Neustadt, P.C.

[57] ABSTRACT

The improved method comprises contacting a substrate 5 at least once by a liquid containing the elements that compose a pure metal or an alloy with which the small holes or recesses 3a in the substrate 5 are to be filled or covered, whereby the liquid wets the inner surfaces of said small holes or recesses 3a while, at the same time, said pure metal or said alloy is deposited on the surface of said substrate 5. The method is capable of filling small holes or covering small recesses in the surface of the substrate 5 with improved efficiency while, at the same time, it improves the heat resistance and materials stability of the part that contains the formed filling or covering layer.

3 Claims, 4 Drawing Sheets

×25,000

×25,000

METHOD FOR FILLING SMALL HOLES OR COVERING SMALL RECESSES IN THE SURFACE OF SUBSTRATES

This application is a continuation of application Ser. No. 08/032,657 filed Mar. 17, 1993, now abandoned.

BACKGROUND OF THE INVENTION

This invention relates to a process for producing precise machine parts, sliding parts, corrosion- or wear-resistant parts, contacting or electroconductive parts, wired boards, printed boards, semiconductor devices, decorative articles, etc. More particularly, this invention relates to a method of filling small holes of covering small recesses in the surface of various substrates.

There has recently been a growing demand for applying surface coatings on various parts, semiconductor devices. Consider, for example, precise machine parts, sliding parts, corrosion- or wear-resistant parts, contacting or electroconductive parts, wired boards, printed boards, semiconductor devices, decorative articles, etc.; it is necessary to make the surfaces of these parts, devices and articles smooth by filling small holes or covering small recesses in those surfaces with an appropriate metal or alloy. With those parts and products, it is necessary to maintain satisfactory dimensional precision, sliding property, corrosion resistance, wear resistance, electric conductivity and gloss. To meet these needs, the intended surface covering and embedding in recesses have been accomplished by vapor-phase techniques such as CVD, sputtering and ion plating or by liquid-phase processes such as electroplating, electroless plating, dip plating and fused salt plating.

The requirements for successful surface covering are, becoming increasingly rigorous these days. Especially in the step of metallizing semiconductor devices, the demand for increasing the level of integration has made it most necessary to establish a technique for forming fine patterns using a material of low electric resistance in place of the heretofore used aluminum (Al) alloys. For such metallization, it is generally held necessary to form fine holes or recesses that are typically not greater than 50 μm in diameter or width but at least 0.1 μm in depth and which have high aspect ratios of 1–100, the aspect ratio being the ratio of depth to diameter or width.

If one attempts to fill such fine holes or cover fine recesses by vapor-phase techniques, considerable difficulty is encountered In applying coverings down to the bottom or deepest area of recesses; in other words, the step coverage that can be attained by the vapor-phase techniques has been low. To correct this problem, it has been necessary to either reduce the depth of small holes and recesses or insure that the vapor phase will flow In a complicated manner during the application of coverings.

Furthermore, the viscosity and surface tension of liquid materials have made it practically impossible to fill holes or cover recesses to their deepest area by liquid-phase processes. To correct this problem, it has been necessary to either reduce the depth of holes and recesses or agitate the liquid phase more vigorously; however, the difficulty for the liquid to penetrate into the smallest recesses has not been completely resolved.

As a further problem, metals of low electric resistance that are used in metallization of semiconductors are generally low in melting point and they will readily react with the surrounding environment to deteriorate by themselves.

SUMMARY OF THE INVENTION

The present invention has been accomplished under these circumstances and has as an object of providing a method for filling small holes or covering small recesses in the surface of a substrate with improved efficiency while, at the same time, improving the heat resistance and materials stability of the formed filling or covering layer.

To attain this object, the method of the present invention is characterized in that the substrate having small holes or recesses in the surface is contacted by a liquid containing the elements and ionic species of elements of a pure metal or an alloy, so that said pure metal or alloy will be deposited on the surface of said substrate.

DETAILED DESCRIPTION OF THE INVENTION

The solution containing the elements that compose a pure metal or an alloy may be brought into contact with the substrate by various methods such as immersion, dripping, coating, spraying and injection. Methods for causing the solution to be deposited on the substrate include precipitation from the solution, adsorption, electrodeposition, plating adhesion and bonding.

In the step of deposition, a controlled varying voltage and/or an energy such as low-frequency, high-frequency or ultrasonic vibrations or a light beam is preferably applied to the substrate. The applicable varying voltage includes voltages of pulsed waveforms such as square wave, trapezoidal wave, triangular wave, sinusoidal wave and random wave. The voltages of such pulsed waveforms may have both positive and negative polarities or they may have only negative polarity. The repetitive voltage components may be zero at periodic times; alternatively, a d.c. component may be added to a periodic wave. The value of the voltage to be applied is preferably such that a maximum absolute value of current density on the surface of the substrate Is in the range of from $10^{-3}$ to $1\ A/cm^2$. The low-frequency, high-frequency or ultrasonic vibrations are preferably such that their frequency is in the range of from 45 Hz to 2.5 GHz.

Figure 1:
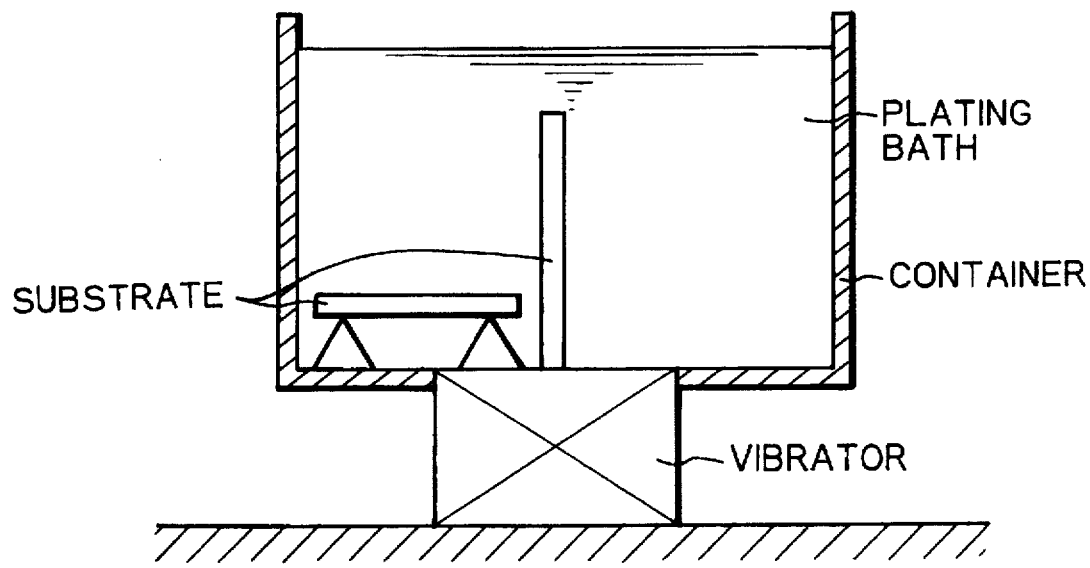
FIG. 1 shows a setup for implementing the method of the present invention with a vibration energy being applied to a substrate.
Figure 2:
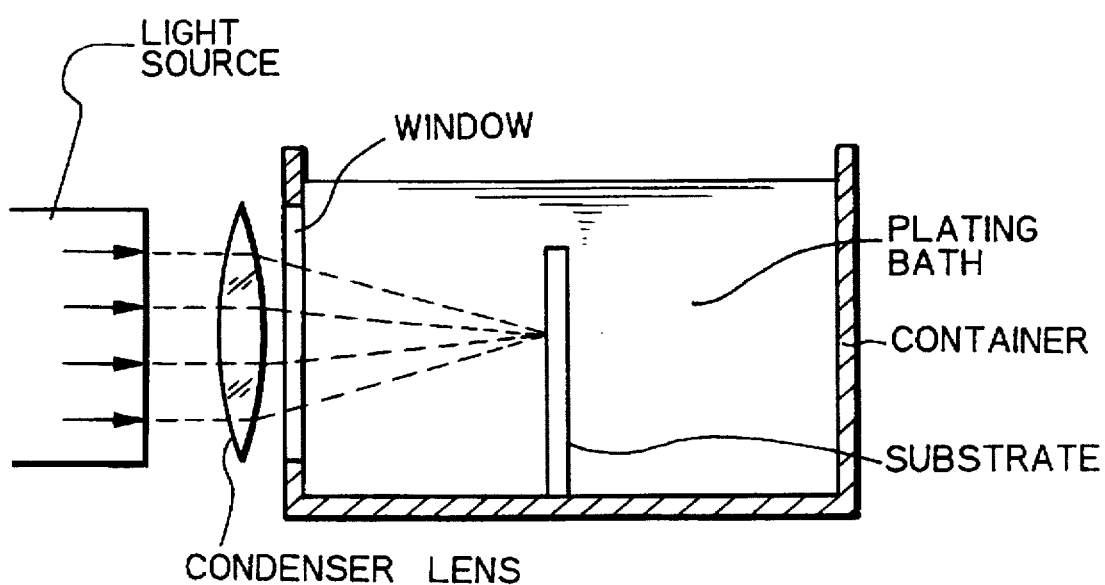
FIG. 2 shows a setup for implementing the method of the present invention with a light energy being applied to a substrate.

Application of voltages or vibrations may be performed with any known apparatus used In the art. A setup for implementing the method of the present invention with a vibration energy being applied is shown in FIG. 1, and a setup for implementing the method of the present Invention with a light energy being applied is shown in FIG. 2. If desired, the small holes and recesses in the surface of a substrate may be first filled or covered with a pure metal or an alloy by the conventional means and, thereafter, the same or different method is applied to have another pure metal or alloy be deposited over the filling or covering layer of the first pure metal or alloy. A specific embodiment of this approach is as follows: the small holes or recesses in the surface of a substrate are first filled or covered with Ag or an Ag alloy or Cu or a Cu alloy and, then, Ni or a Ni alloy such as Ni—B is deposited over the filling or covering layer. This method enables either Implementation of the hot post-treatment which is effective for the process of semiconductor fabrication (since heat resistance is Improved) or prevention of the occurrence of a deleterious surface reaction. It may sometimes become possible to suppress neighboring elements in the filling or covering layer from moving around or penetrating through said layer on account of heat diffusion (which can lead to materials deterioration).

The method of the present invention for filling the small holes or covering the small recesses in the surface of a substrate with a pure metal or an alloy has the advantage that the intended operation can be worked out in an easier and more positive manner than under the conditions adopted by the conventional vapor-phase and liquid-phase filling or covering processes. The substrates having small holes or recesses in the surface that are to be filled or covered may be of any types that are in current use and which have electric conductivity. To name Just a few examples, substrates made from metals, intermetallic compounds, conductive ceramics and conductive plastics are applicable.

According to the method of the present invention, a substrate having small holes or recesses in the surface is contacted by a liquid containing the elements that compose a pure metal or an alloy, so that said pure metal or alloy will be deposited on the surface of said substrate. Unlike the conventional vapor-phase techniques, the method permits the liquid to penetrate through the small holes or recesses to reach the bottom, so that they can be completely filled with the pure metal or alloy to their innermost surfaces covered easily at ordinary pressure. If a voltage of controlled waveform is applied to the substrate during the step of liquid-phase plating, the metal portion that has been once precipitated and deposited will dissolve out again, thereby allowing the small holes or recesses to be filled or covered more uniformly. If an energy such as vibrations or light is further applied, either variations in the local pressure profile occur in the liquid or the formation and extinction of cavities are repeated in the liquid, whereby the liquid will penetrate deep into the small recesses in the surface of the substrate; as a result, the small holes and recesses in the substrate can easily be filled or covered with the intended metal or alloy.

If desired, the filling or covering with Ag or Ag alloy or Cu or Cu alloy may be followed by depositing NI or a Ni alloy such as Ni—B over the filling or covering layer; this approach is capable of not only improving the heat resistance of the material having the filling or covering layer but also suppressing the deterioration of that material due to a deleterious surface reaction or inter-diffusion.

The preferred embodiments of the method of the present Invention for filling the small holes or covering the small recesses in the surface of a substrate are described below with reference to FIGS. 3 and 4.

Figure 3A:
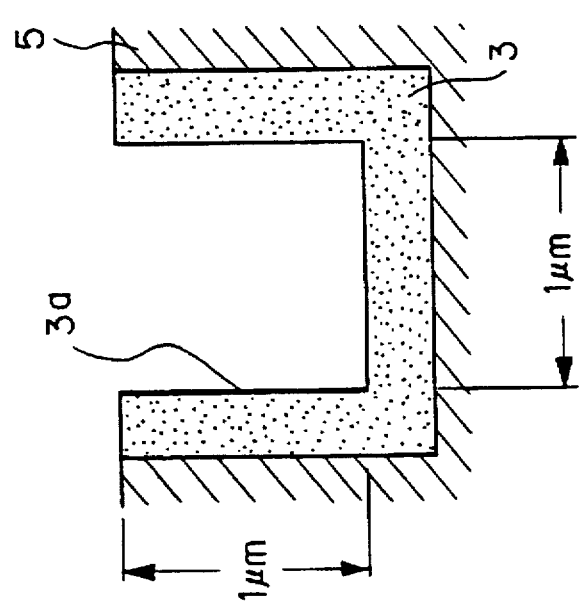
FIG. 3 is a set of diagrams showing an example of the method of the present invention for filling a small hole in the surface of a substrate.
Figure 3B:
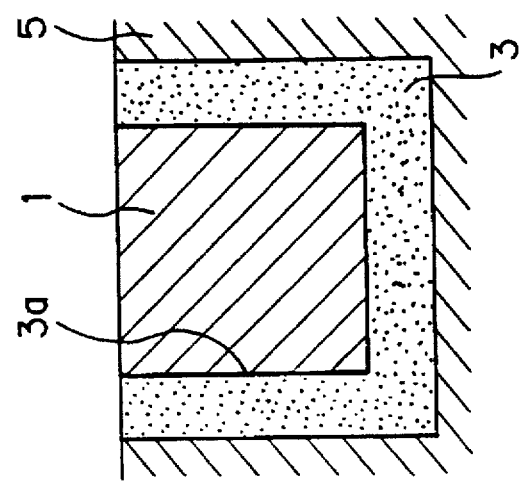
Figure 3C:
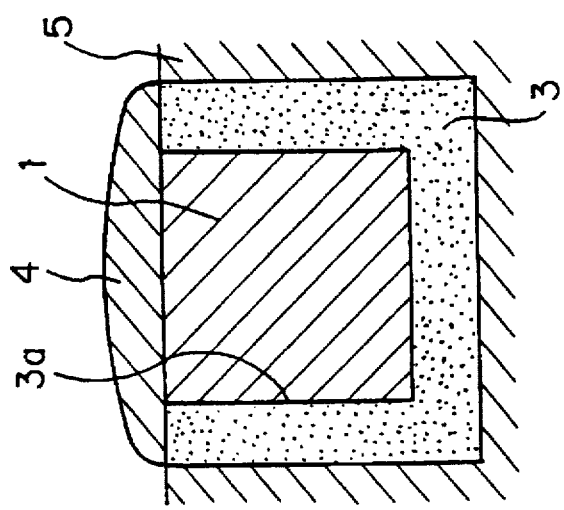

FIG. 3 is a sectional view showing how a small hole in the surface of a substrate was filled in accordance with the present invention. A copper layer 3 was formed on the substrate 5; as shown in FIG. 3(a), the copper layer 3 had in its surface a fine groove 3a that was 1 μm in both width and depth. The copper layer 8 having this fine groove 3a was contacted by a solution of a mixture of potassium silver cyanide and potassium cyanide and a pulsed voltage was applied for a maximum of 20 volts, whereby the inner surface of the groove 3a was wetted by the solution and, at the same time, a silver (Ag) layer 1 was deposited in the groove 3a. In this way, the fine groove 3a in the surface of the copper layer 3 was filled with the silver (Ag) layer 1 as shown In FIG. 3(b). Thereafter, using a solution having a complexing agent and a reducing agent dissolved in $NiSO_4$-$6H_2O$, electroless plating was conducted to have a layer of NI—B alloy 4 deposited over the copper layer 3 and the silver (Ag) layer 1 as shown in FIG. 3(c). If necessary, a vibration energy at low-frequency, high-frequency or ultrasonic frequency in the range of 45 Hz to 2.5 GHz may be applied during the formation of the Ag and Ni—B layers. The vibration energy may be replaced by another form of energy such as light beam.

Figure 4A:
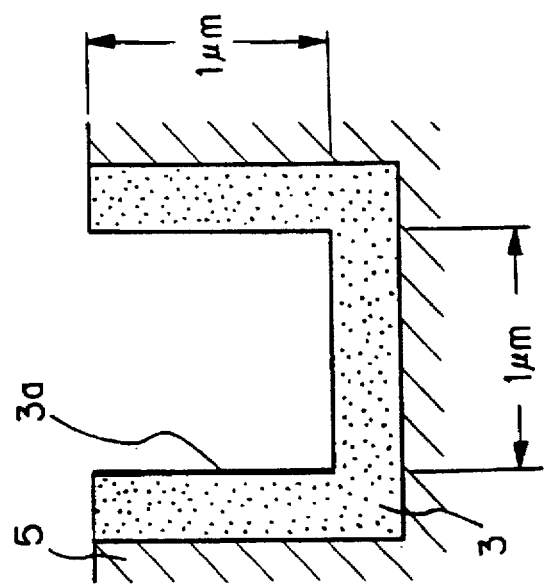
FIG. 4 is a set of diagrams showing an example of the method of the present invention for covering a small recess in the surface of a substrate.
Figure 4B:
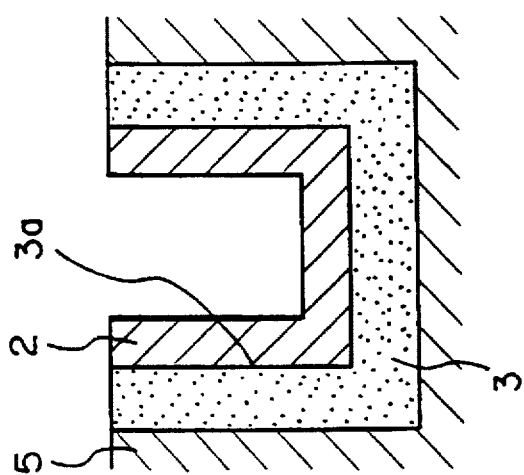
Figure 4C:
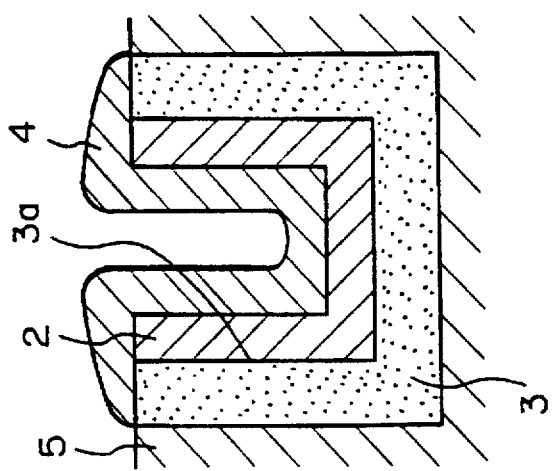
Figure 5:
FIG. 5 shows the result of covering small recesses in the surface of a substrate by the method of the present invention without applying energy.
Figure 6:
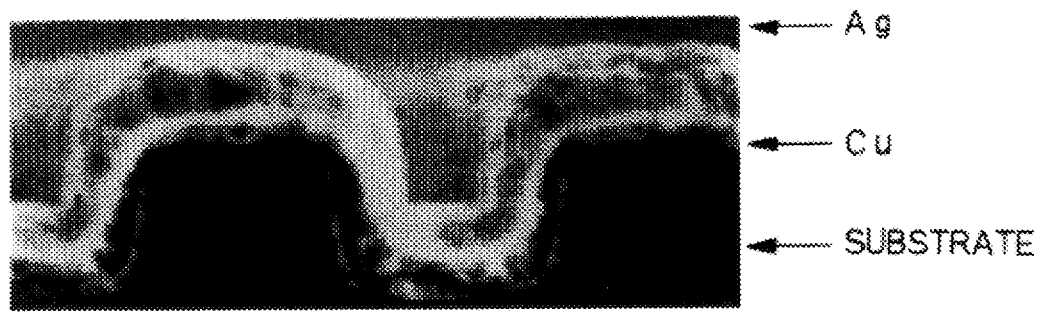
FIG. 6 shows the result of covering small recesses in the surface of a substrate by the method of the present invention, with a vibrating energy being applied at 50 Hz.

FIG. 4 is a sectional view showing how small recesses in the surface of a substrate is covered in accordance with the present invention. A copper layer 3 was formed on the substrate 5; as shown in FIG. 4(a), the copper layer 3 had in its surface a fine groove 3a that was 1 μm in both width and depth. The copper layer 3 having the fine groove 3a was contacted by a solution of a mixture of potassium silver cyanide and potassium cyanide and a pulsed voltage was applied for a maximum of 20 volts, whereby the Inner surface of the groove 3a was wetted by the solution and, at the same time, a silver (Ag) layer 2 was deposited in the groove 3a. In this way, the fine groove 3a In the surface of the copper layer 3 was covered with the silver (Ag) layer 2 as shown in FIG. 4(b). Thereafter, using a solution having a complexing agent and a reducing agent dissolved in $NiSO_4$-$6H_2O$, electroless plating was conducted to have a layer of Ni—B alloy 4 deposited over the copper layer 3 and the silver layer 2 as shown in FIG. 4(b). In this case, too, a vibration or light energy may be applied during the formation of the Ag and Ni—B layers. If needed, the dimensions, geometry and surface state of the first covering layer (i.e., layer 1 in FIG. 3 and layer 2 in FIG. 4) can be altered or modified prior to applying the second layer 4.

As described on the foregoing pages, according to the method of the present invention, a substrate having small holes or recesses in the surface Is contacted at least once by a liquid containing the elements that compose a pure metal or an alloy with which said small holes or recesses are to be filled or covered, whereby said liquid wets the inner surfaces of said small holes or recesses while, at the same time, said pure metal or said alloy is deposited on the surface of said substrate. This method is capable of eliminating the problem that is normally associated with the conventional vapor-phase techniques, namely, the low efficiency with which the small holes or recesses can be filled or covered to the innermost part. The term "small holes or recesses" as used herein means those holes and recesses which are very small and which have high aspect ratios ranging typically from 1 to 100, with their diameter or width being typically no more than 50 μm and the depth being typically at least 0.1 μm. The "aspect ratio" is the ratio of depth to diameter or width for each hole or recess.

The process of filling or covering the small holes or recesses in the surface of a substrate with a pure metal or an alloy can be facilitated by having said pure metal or alloy deposited with a voltage of controlled waveform or an energy such as a vibration or light energy being applied to the substrate.

Further, in accordance with the present invention, the formation of the filling or covering layer may be followed by depositing a layer of a material that is highly resistant to heat and deterioration. As a result, the property of resisting heat and deterioration can be imparted to the part or component having said filling or covering layer and this offers a great industrial benefit.

What is claimed is:

1. A method of filling a recess of not more than about 1 μm in depth and width in a surface of a substrate, which comprises contacting the recess in the surface of the substrate by a solution of a mixture of potassium silver cyanide and potassium cyanide so that said solution wets inner surfaces of said recess to have a silver layer deposited, the method including applying a light energy to the surface of the substrate such that light energy is applied to the surface of the substrate including the recess while said silver layer is being deposited, thereby causing the solution to penetrate deeply to a bottom of the recess so as to permit a filling of the recess, the method further including depositing a Ni—B alloy on at least the silver filling layer by performing electroless plating using a solution of a mixture of NiSO$_4$-6H$_2$O, a complexing agent and a reducing agent, wherein:

the step of applying a light energy includes providing a light source and directing light from said light source through a condenser lens and onto said substrate;

a voltage is applied at a maximum of 20 volts to the surface of the substrate as the silver layer is deposited thereon;

the voltage is applied as a pulsed waveform; and a copper layer is provided in said recess of said substrate prior to contacting said recess with the solution of a mixture of potassium silver cyanide and potassium cyanide such that said solution wets said copper layer.

2. A method according to claim 1 wherein a vibration energy is applied as the silver layer and the Ni—B layer are formed.

3. A method according to claim 2 wherein the vibration energy has a frequency of 45 Hz–2.5 GHz.

* * * * *

UNITED STATES PATENT AND TRADEMARK OFFICE
CERTIFICATE OF CORRECTION

PATENT NO. : 5,705,230

DATED : January 6, 1998

INVENTOR(S): Toru WATANABE, et al.

It is certified that an error appears in the above-identified patent and that said Letters Patent is hereby corrected as shown below:

On the title page, in Item [75], the first inventor's name should be:

--Toru Watanabe--

Signed and Sealed this

Thirtieth Day of November, 1999

Attest:

Q. TODD DICKINSON

*Attesting Officer*  *Acting Commissioner of Patents and Trademarks*